United States Patent [19]

Plies et al.

[11] Patent Number: 4,684,808
[45] Date of Patent: Aug. 4, 1987

[54] SCANNING SYSTEM FOR A PARTICLE BEAM SCANNING APPARATUS

[75] Inventors: Erich Plies; Gerd Kuck, both of Munich, Fed. Rep. of Germany

[73] Assignee: Siemens Aktiengesellschaft, Berlin and Munich, Fed. Rep. of Germany

[21] Appl. No.: 778,486

[22] Filed: Sep. 20, 1985

[30] Foreign Application Priority Data

Sep. 21, 1984 [DE] Fed. Rep. of Germany ....... 3434776

[51] Int. Cl.$^4$ .............................................. H01J 3/26
[52] U.S. Cl. ......................... 250/396 R; 250/396 ML
[58] Field of Search .......... 250/396 R, 396 ML, 311, 250/398; 313/361.1

[56] References Cited

U.S. PATENT DOCUMENTS 4,335,309 6/1982 Anger et al. ................... 250/396 R
4,362,945 12/1982 Riecke ........................... 250/396 R
4,475,044 10/1984 Kuroda et al. ................. 250/396 R

OTHER PUBLICATIONS

Hans Pfeiffer, "Recent Advances in Electron-Beam Lithography for the High-Volume Production of VLSI Devices", *IEEE Transactions on Electron Devices*, vol. ED-26, No. 4, Apr., 1979, pp. 663-673.

*Primary Examiner*—Bruce C. Anderson
*Attorney, Agent, or Firm*—Hill, Van Santen, Steadman & Simpson

[57] ABSTRACT

A scanning lens system for a particle beam scanning device having deflection elements and optical lenses for corpuscular radiation characterized by the deflecting elements being deflecting dipole elements which are disposed in the particle beam directly preceding at least one imaging lens so that the deflection chromatic aberration for arbitrary deflection angles should disappear and the lens field of a magnetic projection lens should be free of magnetic deflection elements. As a result of the arrangement, the isotropic deflection chromatic aberrations of the dynamically deflecting dipole elements compensates the isotropic off-axis chromatic aberrations of at least one imaging lens and at least one imaging lens forms an image rotation-free system.

16 Claims, 7 Drawing Figures

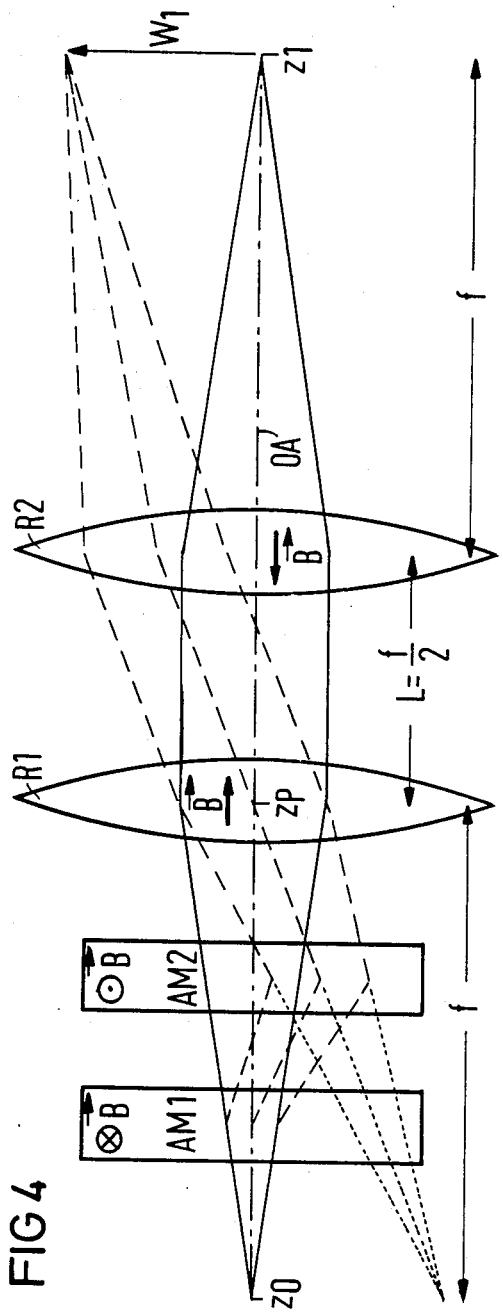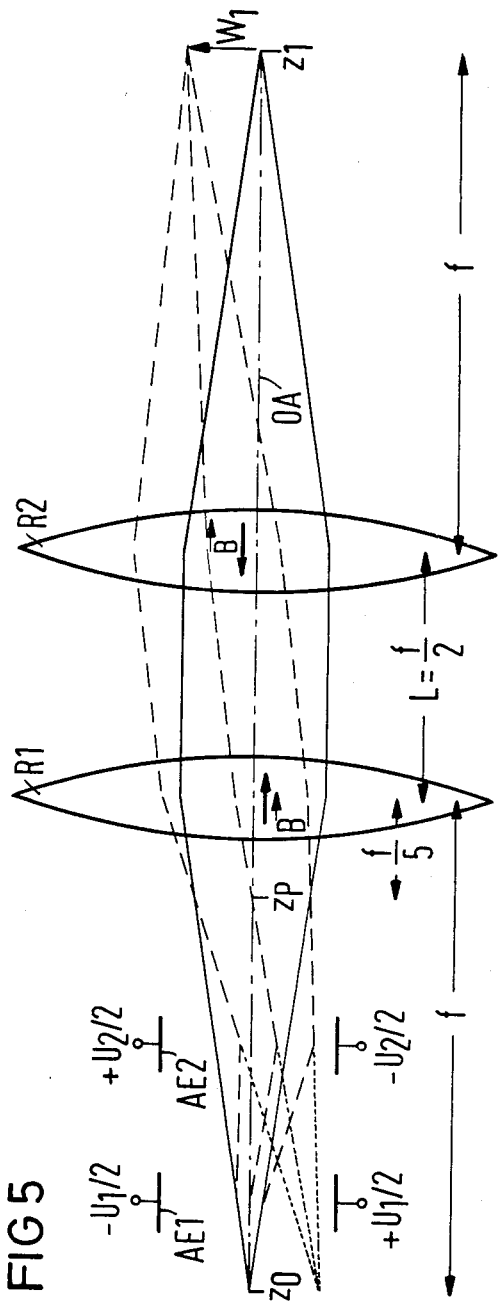

SCANNING SYSTEM FOR A PARTICLE BEAM SCANNING APPARATUS

BACKGROUND OF THE INVENTION

The present invention is directed to a scanning lens system for a scanning particle beam apparatus which has deflection elements and a lens system for corpuscular radiation.

When an electron probe or an ion probe is scanned over a region of a subject with an electrical or with a magnetic deflection system, the probe is usually smeared proportional to the deflection and proportional to the energy width of the beam to form a deflection aberration figure. In addition to the deflection coma, which is not easily connectible, this deflection chromatic aberration significantly contributes to the limitation of the scanned field in scanning particle beam machines for masks and wafers.

Various proposals for the correction of the deflection chromatic aberrations by means of combined electrical and magnetic deflection have been made. For example, a deflection system has been proposed for this purpose which differs from a WIEN filter only on the basis of the selection of the relationship of electrical field strength E to magnetic field strength B. In a WIEN filter, the ratio E/B is selected identical to the mean particle speed v so that the deflection disappears for particles whose speed coincides with the beam particle speed v. However, the dispersion, which causes a deflection chromatic aberration, remains finite. It has been proposed to make the ratio E/B equal to half the mean particle speed, i.e., equal to v/2. Although the dispersion will disappear, the deflection does not disappear for a particle whose speed is equal to the mean particle speed v given this selection of the ratio E/B.

A proposal is disclosed in U.S. Pat. No. 4,335,309 for the correction of the deflection chromatic aberration by means of a combined electrical and magnetic deflection. When given employment of a series-connected electrical and magnetic deflection, the purely magnetic deflection is selected to be twice as great and oppositely equal to the purely electrical deflection and then the deflection chromatic aberration disappears for small deflection angles. Given this principle of series-connected electrical and magnetic deflection, the deflection system must be disposed following the last imaging lens in order to retain the correction of the deflection chromatic aberration in the particle beam path.

An article, Hans Pfeiffer, "Recent Advances in Electron-Beam Lithography for the High-Volume Production of VLSI Devices", *IEEE Transactions on Electron Devices*, Vol. ED-26, No. 4, April 1979, pp. 663–673, discloses an arrangement of a magnetic deflection element in the field of a magnetic projection lens for the correction of the deflection chromatic aberration. Since, however, only an isotropic but not an anistropic component of the deflection chromatic aberration can be corrected by the arrangement of a single magnetic deflection element in the field of a magnetic projection lens, the second magnetic deflection element rotated relative to the first magnetic deflection element is proposed in the field of this magnetic projection lens.

SUMMARY OF THE INVENTION

The object of the present invention is to provide a raster scanning lens system having deflection elements and a lens system for corpuscular radiation wherein the deflection chromatic aberration disappears for arbitrary deflection angles and wherein the lens field of the magnetic projection lens can be free of magnetic deflection elements.

To accomplish these goals, the present invention is directed to an improvement in a raster scanning lens system for a scanning particle beam device comprising deflection elements and a lens system for corpuscular radiation with the improvements comprising dynamically deflecting dipole elements being disposed in a particle beam path in the direction preceding at least one imaging lens wherein an isotropic deflection chromatic aberration of the dynamically deflecting dipole elements compensate the isotropic deflection chromatic aberration of at least one imaging lens and whereby at least one imaging lens forms a rotation-free system.

A raster scanning lens system of the invention is composed of dynamically deflecting dipole elements and of imaging round lenses. The correction principle is thereby based on the compensation of the isotropic deflection chromatic aberration, which the dipole elements have according to their dispersion, by the isotropic off-axis chromatic aberration of the round lenses which arise in the round lenses due to the color dependency of the magnification. The principle is also based on a simultaneous avoidance of the anisotropic off-axis chromatic aberration in the round lenses, which could result from a color dependency of an image rotation and which is avoided because the rotation-free systems are employed.

For the compensation of the isotropic deflection chromatic aberrations, one or more dynamically deflecting dipole fields are disposed such as in the particle beam path either preceding the last round lens or, respectively, preceding the last round lens doublet, and the pivot point lies correction-beneficial, and is identical to the main deflection point given a single-stage deflection. The deflected particle ray beam then passes through the outer zone of the round lens and is steered toward the straight optical axis. For the round lens, the particle ray beam seems to come from an off-axial point of the object plane due to the predeflection so that in contrast to a deflection which does not occur until following the lens as seen in the beam path, the off-axial chromatic aberration of the round lens contributes to the overall deflection chromatic aberration. Since the curvatures of the particle ray beam axis are opposite in the two elements, namely, in the dipole element and in the round lens and since no intermediate image lies between the two elements, the isotropic deflection chromatic aberration of the dipole elements and of the round lens have opposite operational signs. With the three coordinates of the subject plane, of the pivot point and of the image plane on the optical axis and with the selection of the round lens intensity, enough parameters are available in order to achieve a complete compensation of the various contributions to the overall deflection chromatic aberration.

An anisotropic component of the overall deflection chromatic aberration disappears when the lens or, respectively, the lens system following the dynamic deflection is rotation-free. This, for example, is the case when the lens or, respectively, the lens system following the dynamic deflection either acts purely electrically or is a rotation-free, magnetic doublet.

It is thus essential that the lens system following the dynamic deflection is rotation-free and that there is no intermediate image between the dynamic deflection and the lens system.

The dynamic deflection can, for example, be magnetically two-stage, electrically two-stage or even magnetically two-stage for a slow principle deflection and additionally electrically two-stage for a fast, small auxiliary deflection. In addition thereto, further examples for the dynamic deflection preceding the last lens system are conceivable. What is essential is that the isotropic deflection chromatic aberration of the dipole elements and the isotropic off-axis chromatic aberration of the round lenses mutually compensate one another.

Both electron beam devices as well as ion beam devices come into consideration as particle beam devices.

BRIEF DESCRIPTION OF THE DRAWINGS

FIGS. 2 through 6 illustrate exemplary embodiments of the raster scanning lens system incorporating the principles of the present invention.

DESCRIPTION OF THE PREFERRED EMBODIMENTS

The principles of the present invention are particularly useful in a scanning raster lens system such as illustrated in FIGS. 1 through 6. In each of the embodiments of FIGS. 1 through 6, $z_0$ is the coordinate of the subject plane, $z_1$ is the coordinate of the image plane and an optical axis OA extends from the point $z_0$ to the image plane. Each of the embodiments illustrated in FIGS. 1 through 6 include various combinations of electrical deflection elements AE1, AE2, magnetic deflection elements AM1, AM2 and round lenses R1 and R2. The electrical deflection elements in the simplest case are each composed of a pair of capacitor plates disposed symmetrically to the optical axis with the capacitor plates disposed on opposite sides of the optical axis being supplied with voltages having the same amount but opposite operational signs.

Figure 1:
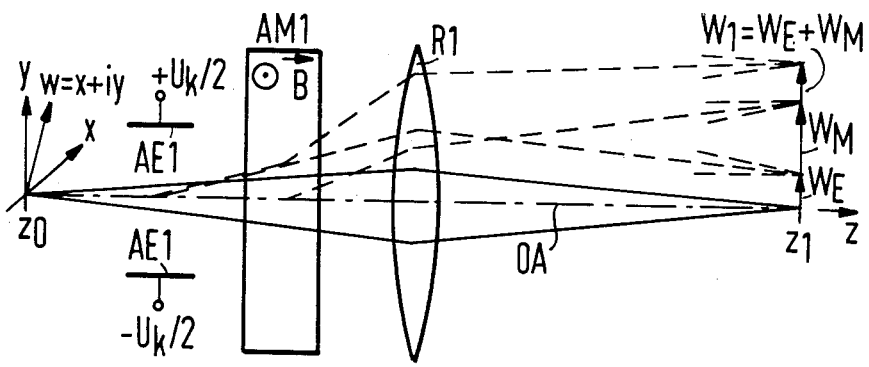
FIG. 1 is a diagrammatic illustration of a raster scanning lens system with predeflection in accordance with the present invention.

The embodiment of FIG. 1 explains the principle of a raster scanning lens system with a predeflection of the invention. For a raster scanning lens system with a magnetic and/or electrical predeflection as shown by way of example in the embodiments of FIGS. 1 through 6, the deflection chromatic aberration can be calculated with the assistance of the following equation:

$$\left.\begin{array}{l} \Delta W_1 = A_F W_1 \frac{\Delta U}{U}, \\ \text{with} \\ A_F = -\frac{W_E + W_M/2}{W_E + W_M} + C_F^V + i\, C_F^D \end{array}\right\} \quad (1)$$

wherein:

$\Delta W_1$ is the complex image aberration $A_F$ is the complex deflection chromatic aberration constant;

U is the acceleration voltage of the particles;

$\Delta U$ is (half) the energy width of the particles;

$W_1 = W_E + W_M$ is the Gaussian deflection in the image plane; and $C_F^V, C_F^D$ are the two off-axial chromatic aberration constants of the round lens R or, respectively, of the round lens system R1, R2 with $C_F^V$ describing the color dependency of the magnification and $C_F^D$ describing the color dependency of the image rotation. To be employed for the chromatic aberration constant $C_F^V$ is that coefficient which derives for the round lens $R_1$ or, respectively, for the round lenses $R_1$ and $R_2$, together with the diaphragm or also when no diaphragm is present. Due to the predeflection, the particle ray beam axis intersects the straight optical axis OA in a pivot point $z_P$ which corresponds without predeflection to the presence of an aperture stop at the pivot point at the coordinate $z_P$ on the optical axis OA. The chromatic aberration constant $C_F^D$ is independent of the stop position.

The predeflection of the particle can be electrically single-stage, electrically two-stage, electrically multi-stage, magnetically single stage, magnetically two-stage, magnetically multi-stage as well as mixed electrical single-stage or multi-stage and magnetically single-stage or multi-stage.

The round lens system can either be purely electrical or a rotation-free magnetic doublet or can be composed of a combination of electrical and magnetic round lenses which are rotation-free as a totality and which are arranged such that no intermediate image is present between the individual elements of the predeflection system and round lens system.

The complex variable w for describing the deflection of the particle beam is defined as $w = x + iy$.

FIG. 1 shows a raster scanning lens system comprising a single-stage electrical deflection element AE1, a single-stage magnetic deflection element AM1 and a single electrical round lens R1. The deflection plates of the deflection element AE1 have the voltage $\pm U_k/2$.

Figure 2:
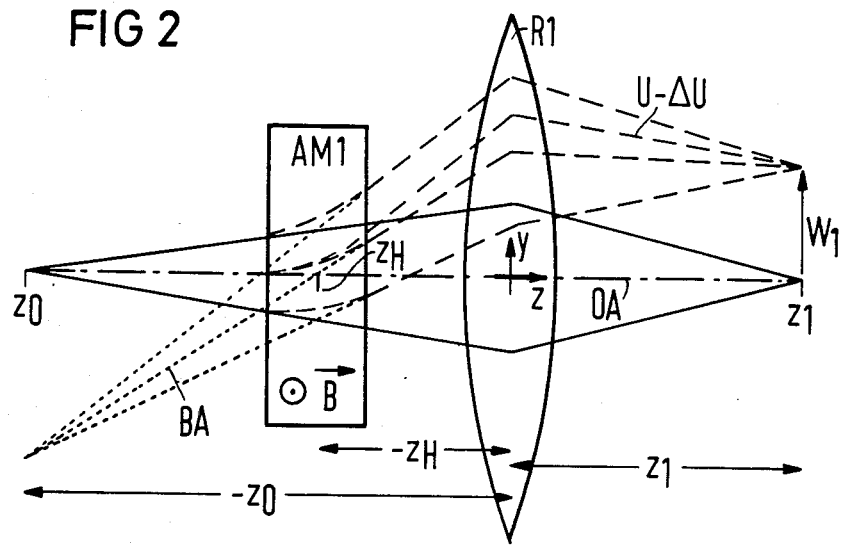

FIG. 2 shows a raster scanning lens system comprising a single-stage magnetic deflection element AM1 and a single-stage electrical round lens R1.

Figure 3:
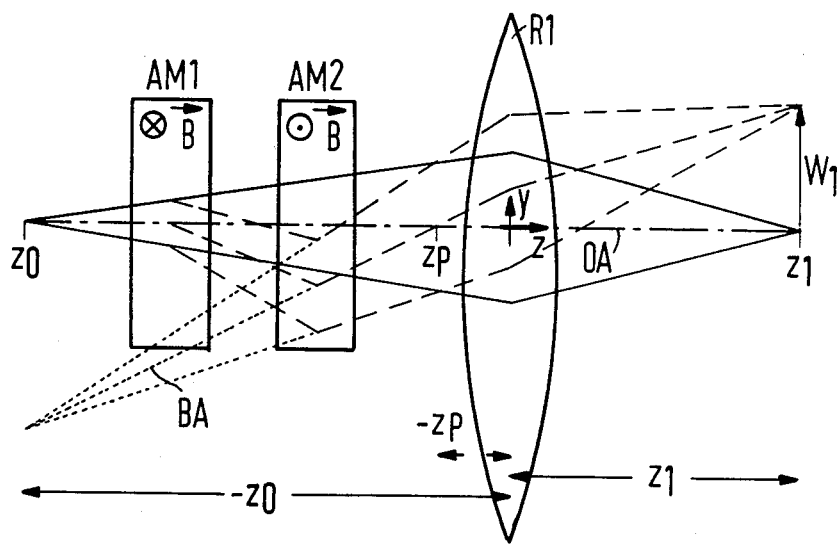

FIG. 3 shows a two-stage system for predeflection comprising two magnetic deflection elements AM1 and AM2 and a single electrical round lens R1.

FIGS. 2 and 3 also show how a particle beam cone axis BA intersects the straight optical axis OA at a pivot point with the coordinates $z_P$. Due to the predeflection, this corresponds to the presence of an aperture stop at the coordinate $z_P$ without predeflection. Since only a single-stage predeflection is present in FIG. 2, the pivot point corresponds to the main deflection point which is disposed at the coordinate $z_H$.

The particle beam cone axis BA corresponds to that axis along which those particles move which move centrally toward the raster scanning lens sytems on an optical axis OA and thereby have the energy U. FIG. 2 additionally shows that the path course along which such particles move which, although they likewise move toward the raster scanning lens system centrally on the optical axis, have an energy $U - \Delta U$. This path is identified in FIG. 2 as $U - \Delta U$.

FIG. 4 shows a raster scanning lens system having a two-stage magnetic predeflection and comprising a rotation-free magnetic round lens doublet. The predeflection occurs at the two magnetic deflection elements AM1 and AM2. The magnetic round lens system is composed of two round lenses R1 and R2. For the raster scanning lens system of FIG. 4, the deflection chromatic aberration coefficient is simplified to $$A_F = -\tfrac{1}{2} + C_F^V + i\, C_F^D \qquad (2)$$

The rotational chromatic aberration of the magnetic round lens doublet can be written in the following fashion:

$$C_F^D = +\left(\frac{k_1}{(1+k_1^2)^{\frac{1}{2}}} + \frac{k_2}{(1+k_2^2)^{\frac{1}{2}}}\right) \cdot \frac{\pi}{2} \quad (3)$$

$$\approx +\frac{\pi}{2}(k_1 + k_2) \text{ for short, weak lenses,}$$

whereby $k_1^2$ and $k_2^2$ are the lens intensities of the two double lenses R1, R2 and whereby, with the assistance of the excitations $N_1I_1$ and $N_2I_2$, it can be written:

$$k_i^2 = 0.00352 \frac{(N_iI_i/A)^2}{U^*/V}; i = 1,2 \quad (4)$$

The excitation $N_1I_1$ and $N_2I_2$ are entered in amperes in this equation; and the acceleration voltage $U^*$ is entered in volts. The acceleration voltage $U^*$ is obtained when the energy of the particles is divided by their charge and the absolute value thereof is taken.

Figure 7:
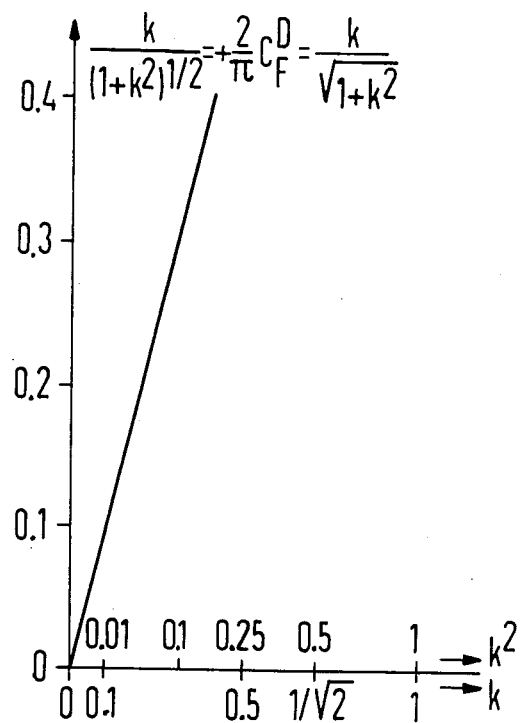
FIG. 7 explains a rotational chromatic aberration for round lenses.

It can be directly seen from equation (3) and from FIG. 7 that the coefficient $C_F^D$ of the doublet disappears when the two individual lenses R1 and R2 are oppositely excited but excited with equal strength:

$$k_1 = -k_2 \quad (5)$$

When, as given the coefficient $C_F^D$, the Glaser bell-shaped fields are again employed, the following is obtained for the magnetic chromatic aberration of the doublet:

$$\begin{aligned}
C_F^V &= \frac{\pi}{2}\left\{\frac{k_1^2}{\omega_1^2}\cot\omega_1(\tilde{\phi}_O - \tilde{\phi}_P) + \frac{k_2^2}{\omega_2^2}\cot\omega_2(\tilde{\phi}_O - \tilde{\phi}_P)\right\} \\
\text{with} \\
\omega_i &= \sqrt{1 + k_i^2}, i = 1,2; \\
d_i &= \text{half the half width of the Glaser bellfield, } i = 1,2; \\
\cot\tilde{\phi}_P &= \left\{d_1\cot\left(\phi_P - \frac{\pi}{\omega_1}\right) - L\right\}/d_2; \\
\cot\tilde{\phi}_O &= \left\{d_1\cot\left(\phi_O - \frac{\pi}{\omega_1}\right) - L\right\}/d_2; \\
\cot\phi_O &= z_O/d_1; \\
\cot\phi_P &= z_P/d_1; \\
z_O &= \text{coordinate of the object plane;} \\
z_P &= \text{coordinate of the pivot point;} \\
L &= \text{center distance of the doublet lenses R1, R2.}
\end{aligned} \quad (6)$$

When the object plane having the coordinate $z_0$ as shown in FIG. 2 is placed into a front focal plane of the first doublet lens R1 and when the two lenses R1 and R2 are still assumed to be weak, then when the focal length of the two lenses R1 and R2 is equal to the focal lens, there follows:

$$C_F^V = -\frac{2z_P}{z_P + f} + \frac{L}{f} \quad (7)$$

For the correction of the isotropic deflection chromatic aberration which is the real part of $A_F$, the coefficient $C_F^V$ must be equal to one-half which, for example, can be achieved by the value pair:

$$z_P = 0 \text{ and } L/f = 0.5 \quad (8)$$

This value pair of equation (8), which is assumed as an example, is illustrated in FIG. 4. There is an entire range of values $z_P/f$, $L/f$, which meet the correction condition, namely, that the coefficient $C_F^V$ must be equal to one-half. Because the distance L between the centers of the two lenses R1 and R2 is greater than 0, however, only pivot points whose coordinates $z_P$ is greater than $-f/5$ come into consideration. Extremely great distance L between the two lenses R1 and R2 are eliminated for technological reasons.

In FIG. 5, an embodiment of a raster scanning lens system which has a two-stage electrical deflection and a rotation-free magnetic round lens doublet, is illustrated. The two-stage electrical deflection system thereby comprises the two deflection elements AE1 and AE2. The round lens doublet is again composed of two magnetic lenses R1 and R2. Given purely electrical deflection, equation (1) is simplified to $$A_F = -1 + C_F^V + i\, C_F^D \quad (9)$$

The same round lens doublet as in the exemplary embodiment of FIG. 4 is employed in the embodiment of FIG. 5. In the exemplary embodiment of FIG. 5, the coefficient $C_F^D$, which describes the rotational chromatic aberration, is equal to 0. For the correction of the isotropic chromatic deflection error, the coefficient $C_F^V$ must be equal to 1. Together with the equation (7), the exemplary value
  $L/f = 0.5$ taken from the embodiment of FIG. 4. This demand yields the coordinate $z_P = -f/5$ for the pivot point. In addition to the example for the value pair:

$$z_P = -f/5 \text{ and } L/f = 0.5 \quad (10)$$

there is also a two-dimensional value range given a raster scanning lens system of FIG. 5 for the correction of the isotropic deflection chromatic aberration which is the real part of $A_F$, just as in the exemplary embodiment of FIG. 4. However, because the distance L between the centers of the two doublet lenses R1 and R2 in the exemplary embodiment of FIG. 5 is also greater than 0, the two-dimensional value range given in the exemplary embodiment of FIG. 5 is also limited. Thus, the coordinate $z_P$ of the pivot point is greater than $-f/3$.

Figure 6:
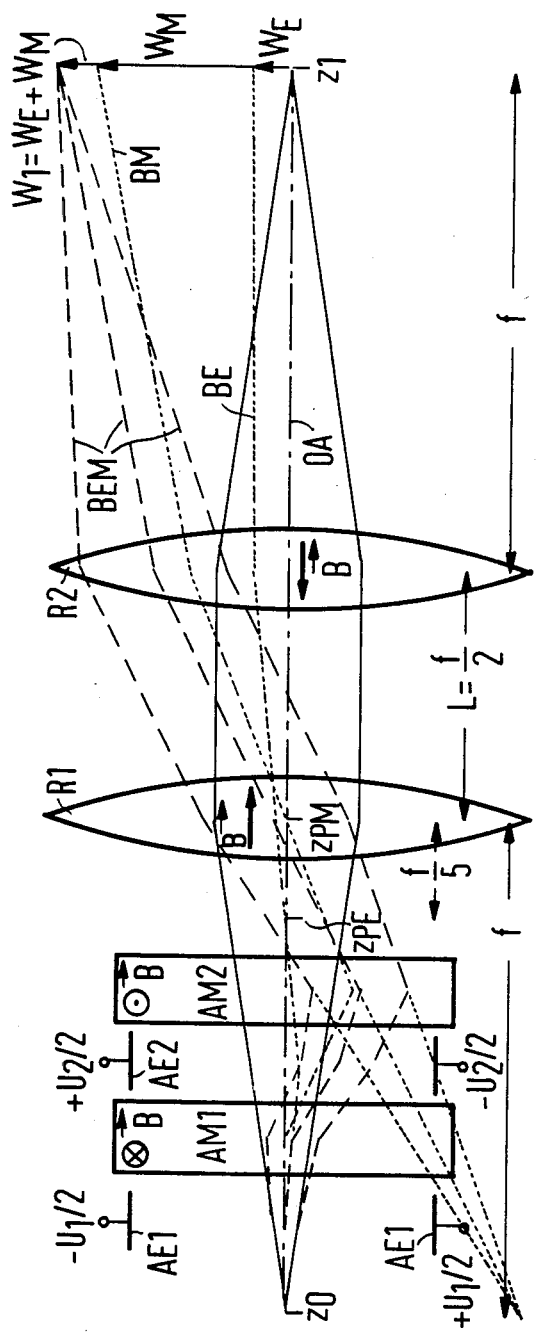

An embodiment of the raster scanning lens system is illustrated in FIG. 6 and has a system for slow magnetic principal deflection and for fast electrical auxiliary deflection. The predeflection system is thereby constructed so that an electrical deflection element AE1 is disposed first in the particle beam direction, then a magnetic deflection element AM1, then another electrical deflection unit AE2 and finally another magnetic deflection unit AM2. The pivot points $z_{PM}$ and $z_{PE}$ for the purely magnetic and respectively for the purely electrical deflection are selected such that the isotropic deflection chromatic aberration is equal to 0 for purely magnetic or, respectively, purely electrical deflection. When the deflection is carried out mixed, i.e., both magnetically as well as electrically, then the real part of $A_F$ is no longer completely equal to 0. When the electrical deflection is small in comparison to the magnetic deflection, then the remainder remains with $$A_F \approx -\frac{1}{2}\left\{ \frac{W_E}{W_M} - \left(\frac{W_E}{W_M}\right)^2 \right\} . \quad (11)$$

When the absolute amount of the purely electrical deflection $W_E$ is less than 1/10 of the absolute amount of the purely magnetic deflection $W_M$, when the acceleration voltage U for the electrons is equal to 20 kV, when half the energy width $\Delta U$ of the electron beam cone is equal to 5 volts and when the absolute amount of the complex image error $\Delta W_1$ is smaller than 0.05 μm, an allowed excursion which is the absolute amount of $W_1$ of less than 4 mm is obtained in the raster or scan plane with equations (11) and (1). Thus, a square region of 5.6×5.6 mm² can be scanned with deflection chromatic aberrations equal to twice the absolute value of $\Delta W_1$ and of less than 0.1 μm. Such a system of FIG. 6 thus can be excellently adapted to the respective demands of, for example, a fast scanning electron beam lithography system.

In FIG. 6, BE refers to the cone axis of a purely electrically deflected electron beam cone, BM refers to the cone axis of the purely magnetically deflected electron beam cone and BEM refers to an electrically and magnetically deflected electron beam cone.

FIG. 7 explains the rotational chromatic aberration of the magnetic Glaser bellshaped field as was employed in equation (3). The coefficient $C_F^D$ identifying the rotational chromatic aberration grows monotonously and asymptotically approaches $\pi/2$ for large values of k.

The imaging lenses R1 and R2 need not necessarily be free of image rotation. The overall imaging lens system following the deflection system in particle beam direction must merely be image rotation-free overall. Any combination of lenses R1 and R2, which, for example, form an image rotation-free lens system, is utilizable for exemplary embodiments of the invention.

Although various minor modifications may be suggested by those versed in the art, it should be understood that we wish to embody within the scope of the patent granted hereon, all such modifications as reasonably and properly come within the scope of our contribution to the art.

We claim:

1. In a scanning lens system for a scanning particle beam device having deflection elements and lenses for corpuscular radiation, the improvements comprising dynamically deflecting dipole elements being disposed in the particle beam directly preceding at least one imaging lens so that the isotropic deflection chromatic aberration of the dynamically deflecting dipole element compensates the isotropic off-axis chromatic aberration of at least one imaging lens and whereby at least one imaging lens forms an image rotation-free system.

2. In a scanning lens system according to claim 1, wherein the dynamic deflecting dipole elements include magnetic deflection elements for slow principle deflection and electrical deflection elements for a fast auxiliary deflection.

3. In a scanning lens system according to claim 2, wherein the imaging lens comprises an image rotation-free magnetic doublet.

4. In a scanning lens system according to claim 3, wherein the deflecting dipole elements are arranged in the following order, an electrical deflection element followed by a magnetic deflection element followed by a second electrical deflection element followed by a second magnetic element followed by the image rotation-free magnetic doublet.

5. In a scanning lens system according to claim 1, wherein at least one imaging lens is designed as an image rotation-free round lens.

6. In a scanning lens system according to claim 1, wherein at least one imaging lens is designed as an electrical lens.

7. In a scanning lens system according to claim 1, wherein the imaging lenses are constructed as an image rotation-free magnetic doublet.

8. In a scanning lens system according to claim 1, wherein at least one of the deflecting dipole elements is an electrically deflecting element.

9. In a scanning lens system according to claim 1, wherein at least one of the deflecting dipole elements is a magnetic deflecting element.

10. In a scanning lens system according to claim 9, which has one imaging lens.

11. In a scanning lens system according to claim 10, wherein the deflection dipole element includes at least one electrical deflection element.

12. In a scanning lens system according to claim 1, wherein the deflecting dipole elements include one magnetic deflection system of at least two separate magnetic deflecting dipoles.

13. In a scanning lens system according to claim 12, which has one imaging lens.

14. In a scanning lens system according to claim 12, wherein the imaging lenses comprise an image rotation-free magnetic doublet.

15. In a scanning lens system according to claim 1, wherein the deflecting dipole elements include two separate electrically deflecting elements.

16. In a scanning lens system according to claim 15, wherein the imaging lens is a magnetic doublet.

* * * * *